(12) United States Patent
Pan et al.

(10) Patent No.: US 10,361,137 B2
(45) Date of Patent: Jul. 23, 2019

(54) SEMICONDUCTOR DEVICE AND METHOD

(71) Applicant: Taiwan Semiconductor Manufacturing Company, Ltd., Hsinchu (TW)

(72) Inventors: Yin-Jie Pan, New Taipei (TW); Yu-Yun Peng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/871,528

(22) Filed: Jan. 15, 2018

(65) Prior Publication Data

US 2019/0035704 A1    Jan. 31, 2019

Related U.S. Application Data

(60) Provisional application No. 62/539,270, filed on Jul. 31, 2017.

(51) Int. Cl.
| | | |
|---|---|---|
| *H01L 23/14* | (2006.01) | |
| *H01L 21/02* | (2006.01) | |
| *H01L 21/311* | (2006.01) | |
| *H01L 21/768* | (2006.01) | |

(52) U.S. Cl.
CPC ...... *H01L 23/147* (2013.01); *H01L 21/02118* (2013.01); *H01L 21/02126* (2013.01); *H01L 21/02203* (2013.01); *H01L 21/02216* (2013.01); *H01L 21/02219* (2013.01); *H01L 21/02271* (2013.01); *H01L 21/02348* (2013.01); *H01L 21/31144* (2013.01); *H01L 21/768* (2013.01)

(58) Field of Classification Search
CPC ......... H01L 21/02126; H01L 21/02134; H01L 21/02137; H01L 21/02348
See application file for complete search history.

(56) References Cited

U.S. PATENT DOCUMENTS

| | | | |
|---|---|---|---|
| 6,846,515 B2 | 1/2005 | Vrtis et al. | |
| 7,906,174 B1* | 3/2011 | Wu ..................... | C23C 16/401 427/248.1 |
| 2003/0001239 A1* | 1/2003 | Gallahger ............... | H01B 3/46 257/632 |
| 2006/0135633 A1* | 6/2006 | Lee ........................ | C08J 5/18 521/50 |
| 2011/0006406 A1* | 1/2011 | Urbanowicz ........ | C23C 16/401 257/632 |

(Continued)

OTHER PUBLICATIONS

Baklanov, M.R., et al., "Plasma processing of low-k dielectrics," Journal of Applied Physics vol. 113, 041101 (2013), Jan. 22, 2013, 42 pgs.

(Continued)

*Primary Examiner* — Bryan R Junge
(74) *Attorney, Agent, or Firm* — Slater Matsil, LLP

(57) ABSTRACT

A semiconductor device and method of manufacture comprise forming a channel-less, porous low K material. The material may be formed using a silicon backbone precursor and a hydrocarbon precursor to form a matrix material. The material may then be cured to remove a porogen and help to collapse channels within the material. As such, the material may be formed with a scaling factor of less than or equal to about 1.8.

20 Claims, 12 Drawing Sheets

(56) References Cited

U.S. PATENT DOCUMENTS

| | | | |
|---|---|---|---|
| 2011/0204525 A1* | 8/2011 | Seo | H01L 21/02203 |
| | | | 257/774 |
| 2013/0344704 A1* | 12/2013 | Chhabra | C23C 14/00 |
| | | | 438/778 |
| 2018/0068848 A1* | 3/2018 | Shohet | H01L 21/02164 |

OTHER PUBLICATIONS

Barranco, A., et al., "Room temperature synthesis of porous SiO2 thin films by plasma enhanced chemical vapor deposition," J. Vac. Sci. Technol. A, vol. 22, No. 4, Jul. 16, 2004, pp. 1275-1284.

Loboda, M.J., "New solutions for intermetal dielectrics using trimethylsilane-based PECVD processes," Microelectronic Engineering vol. 50 (2000), pp. 15-23.

Park, Y-K., et al., "Controlling solvent diffusivity via architecture of nanopore structures in porous low-k films," Microporous and Mesoporous Materials vol. 142 (2011), Nov. 25, 2010, pp. 91-97.

Zhou, H., et al., "Thickness dependent glass transition temperature of PECVD low-k dielectric thin films: effect of deposition methods," Microelectronics Journal vol. 33, Mar. 2002, accepted Sep. 26, 2001, pp. 221-227.

Zhou, J., "Resistive switching characteristics of PECVD-deposited porous SiO2-based electrochemical metallisation memory cells," Electronics Letters, vol. 52, No. 11, May 26, 2016, pp. 965-966.

* cited by examiner

SEMICONDUCTOR DEVICE AND METHOD

PRIORITY CLAIM AND CROSS-REFERENCE

This application claims the benefit to U.S. Provisional Patent Application No. 62/539,270, filed on Jul. 31, 2017, and entitled "Semiconductor Device and Method," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
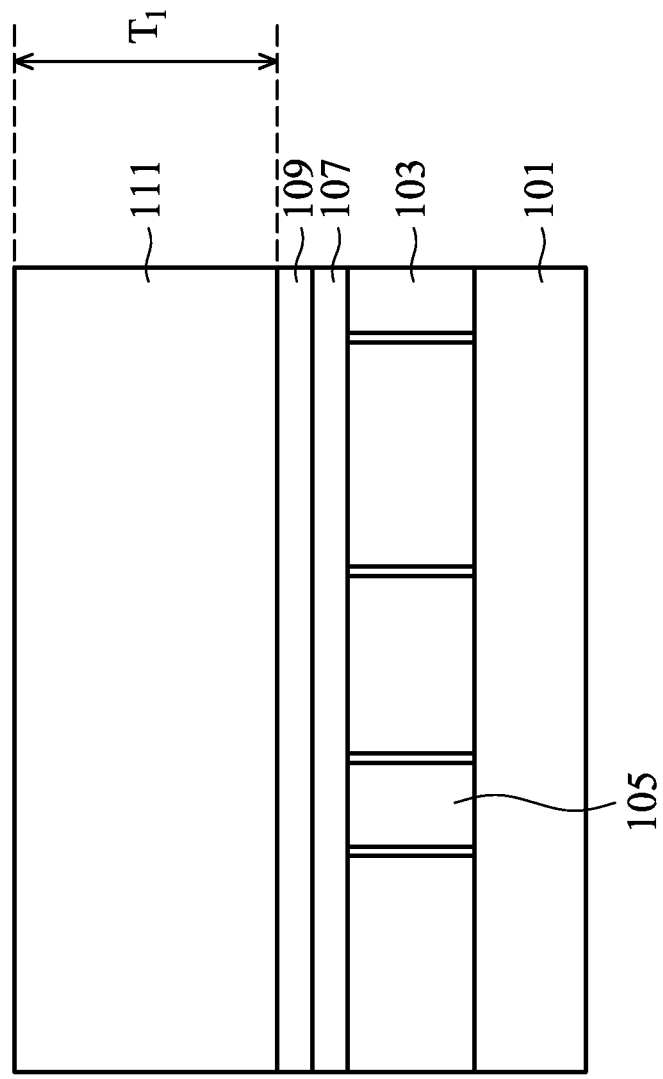
FIGS. 1A-1D illustrate a formation of a first dielectric layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described below with respect to a dielectric material utilized as an intermetal dielectric layer for a back end of line interconnect process. However, the embodiments are not intended to be limited to such uses.

With reference now to FIG. 1A, FIG. 1A illustrates a substrate 101 with active devices (not separately illustrated), metallization layers 103 over the substrate 101, conductive elements 105 within the metallization layers 103, a first etch stop layer 107, an optional second etch stop layer 109, and a first dielectric layer 111. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 101.

The metallization layers 103 are formed over the substrate 101 and the active devices and are designed to connect the various active devices to form functional circuitry for the design. In an embodiment the metallization layers are formed of alternating layers of dielectric and conductive material and may be formed through any suitable process (such as deposition, damascene, dual damascene, etc.). In an embodiment there may be one to twelve layers of metallization separated from the substrate 101 by at least one interlayer dielectric layer (ILD), but the precise number of metallization layers is dependent upon the design.

The conductive elements 105 may be formed in an upper portion of the metallization layers 103, and is a region to which an interconnect 801 (not illustrated in FIG. 1A but illustrated and described below with respect to FIG. 8) will make physical and electrical connection. In an embodiment the conductive elements 105 may be a material such as copper formed using, e.g., a damascene or dual damascene process, whereby an opening is formed within an upper portion of the metallization layers 103, the opening is filled and/or overfilled with a conductive material such as copper, and a planarization process is performed to embed the conductive material within the metallization layers 103. However, any suitable material and any suitable process may be used to form the conductive elements 105.

A first etch stop layer 107 is used to protect the underlying structures and provide a control point for a subsequent etching process through, e.g., the second etch stop layer 109. In one embodiment, the first etch stop layer 107 may be formed of silicon oxide, silicon nitride, silicon carbon nitride (SiCN), silicon carbon oxide (SiCO), or a metal oxide or nitride such as aluminum oxide ($AlO_x$), $AlN_x$, $AlO_xN_y$, $TiO_x$, $TiO_xN_y$, $ZnO_x$, $MnO_x$, combinations of these, or the like. The first etch stop layer 107 may be formed using plasma enhanced chemical vapor deposition (PECVD), plasma enhanced atomic layer deposition (PEALD), thermal atomic layer deposition, or physical vapor deposition process. The first etch stop layer 107 may have a thickness of between about 5 Å and about 100 Å, such as about 30 Å.

Once the first etch stop layer 107 has been formed to cover the conductive elements 105, the second etch stop layer 109 is formed over the first etch stop layer 107 to protect the underlying structures and provide a control point for a subsequent etching process through, e.g., the first dielectric layer 111. In one embodiment, the second etch stop layer 109 may be formed of silicon oxide, silicon nitride, silicon carbon nitride (SiCN), silicon carbon oxide (SiCO), or a metal oxide or nitride such as aluminum oxide ($AlO_x$), $AlN_x$, $AlO_xN_y$, $TiO_x$, $TiO_xN_y$, $ZnO_x$, $MnO_x$, combinations of these, or the like. The second etch stop layer 109 may be formed using plasma enhanced chemical vapor deposition (PECVD), plasma enhanced atomic layer deposition (PEALD), thermal atomic layer deposition, or physical vapor deposition process. The second etch stop layer 109 may have a thickness of between about 25 Å and about 100 Å, such as about 40 Å.

Once the second etch stop layer 109 has been formed, the first dielectric layer 111 may be formed in order to help isolate the interconnect 801 from other adjacent electrical routing lines. In an embodiment the first dielectric layer 111 may be, e.g., a low-k dielectric film intended to help isolate the interconnect 801 from other structures. By isolating the interconnect 801, the resistance-capacitance (RC) delay of the interconnect 801 may be reduced, thereby improving the overall efficiency and speed of electricity through the interconnect 801.

In an embodiment the first dielectric layer 111 may be a low diffusivity channel-less porous low-k material such as SiOC:H and may be formed by initially forming as-deposited film over the second etch stop layer 109. The as-deposited film may comprise both a matrix material and a porogen interspersed within the matrix material (either covalently bonded to the matrix material or interspersed but not bonded to the matrix material). In an embodiment the as-deposited film may be formed, e.g., by co-depositing the matrix material and the porogen using a chemical vapor deposition process such as plasma enhanced chemical vapor deposition (PECVD), low pressure CVD (LPCVD), thermal CVD, combinations of these, or the like where the matrix material is deposited at the same time as the porogen, thereby forming the as-deposited film with the matrix material and the porogen mixed together. However, any suitable process may be utilized.

The as-deposited film may be formed to a thickness sufficient to provide the isolation and routing characteristics that are desired of the first dielectric layer 111. In an embodiment, the as-deposited film may be formed to a first thickness $T_1$ of between about 100 Å and about 2000 Å, such as about 500 Å. However, these thicknesses are meant to be illustrative only, and are not intended to limit the scope of the embodiments, as the precise thickness of the as-deposited film may be any suitable desired thickness.

Figure 2:
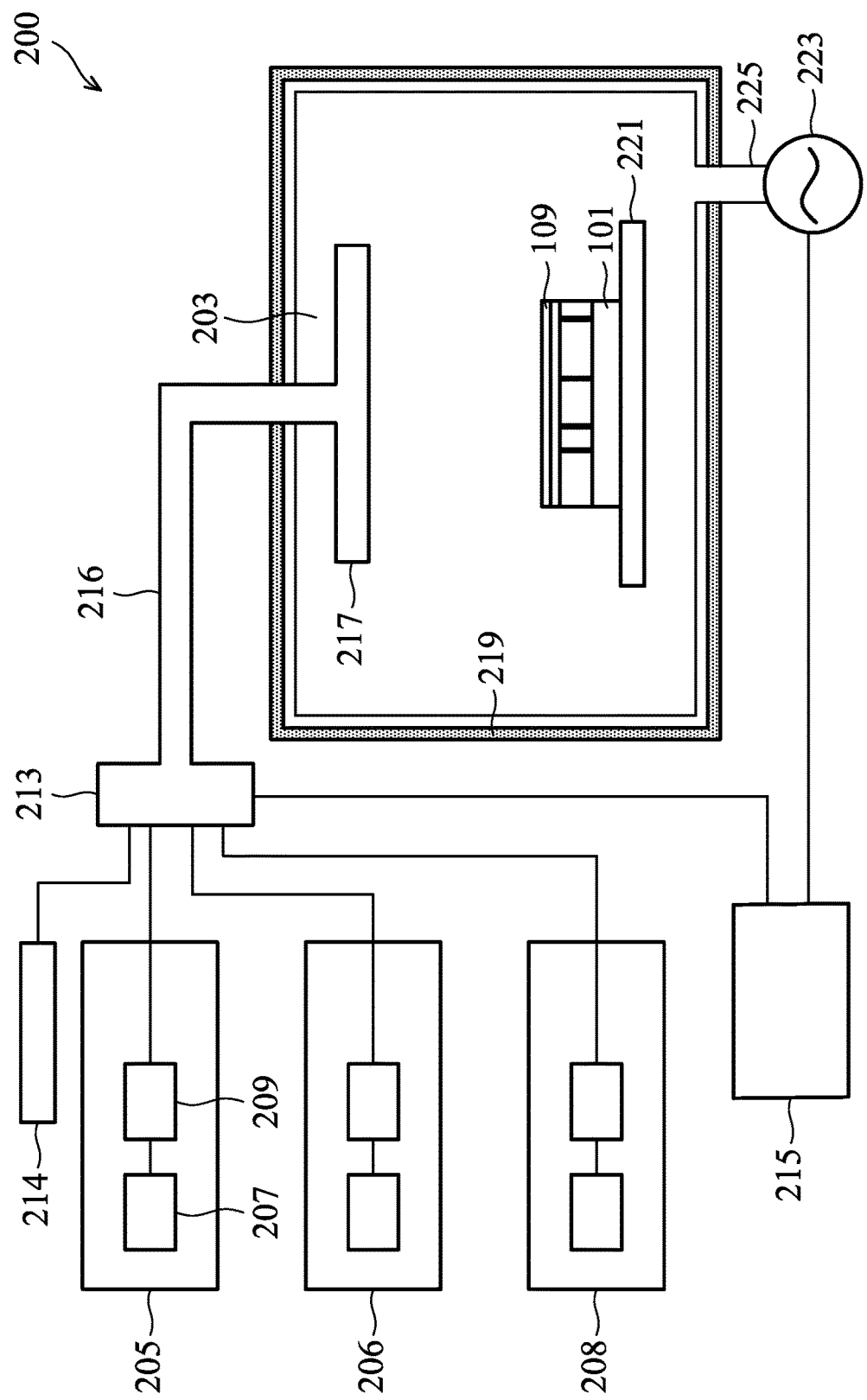
FIG. 2 illustrates a deposition chamber in accordance with some embodiments.
Figure 3:
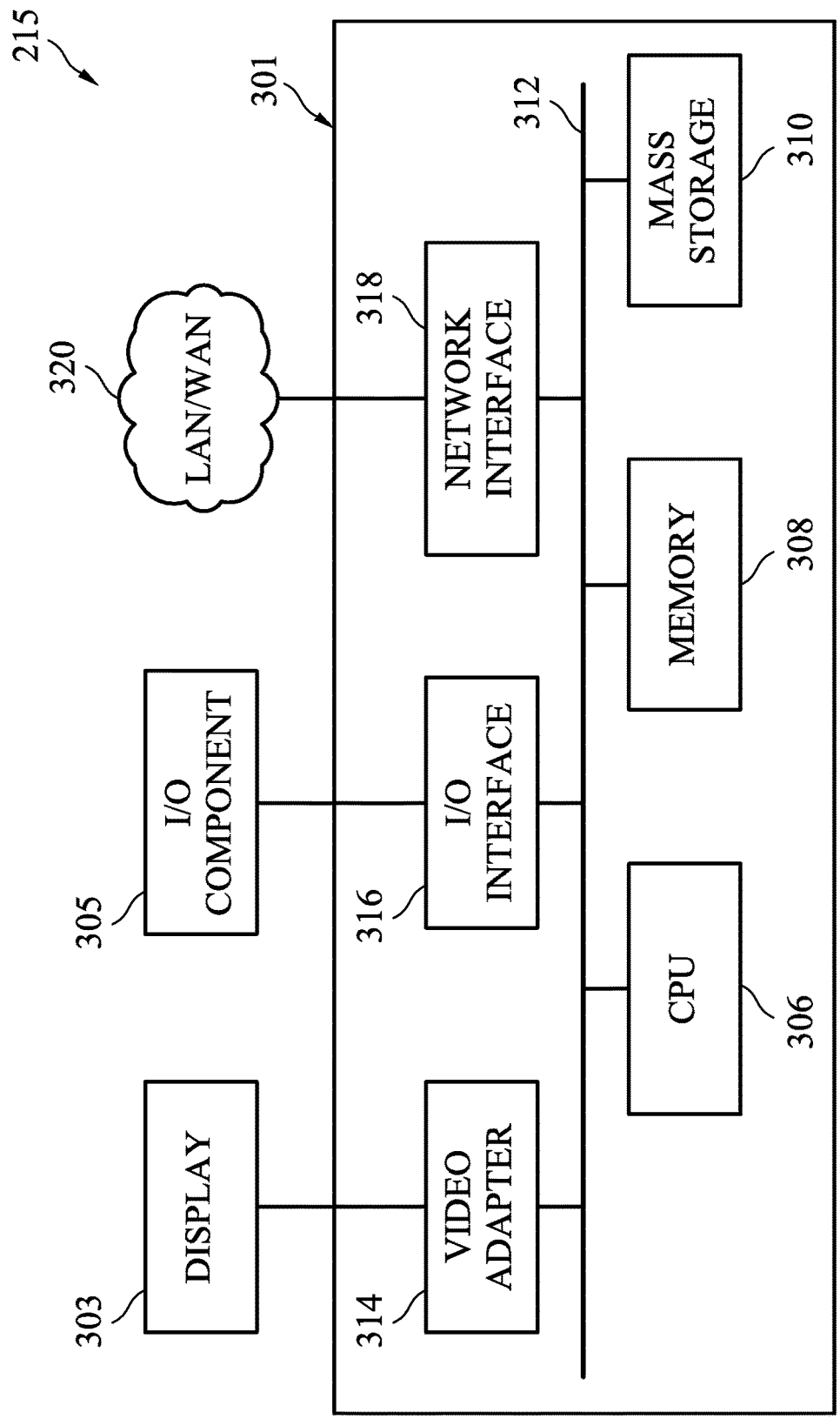
FIG. 3 illustrates a control unit for the deposition chamber in accordance with some embodiments.

FIGS. 2-3 illustrate a deposition system 200 that may be utilized to receive precursor materials from a first precursor delivery system 205, a second precursor delivery system 206, and a reactant delivery system 208 and form layers of materials onto the substrate 101. In an embodiment the first precursor delivery system 205, the second precursor delivery system 206, and the reactant delivery system 208 may work in conjunction with one another to supply the various different precursor materials to a deposition chamber 203 wherein the substrate 101 is placed. However, the first precursor delivery system 205, the second precursor delivery system 206, and the reactant delivery system 208 may have physical components that are similar with each other.

For example, the first precursor delivery system 205, the second precursor delivery system 206, and the reactant delivery system 208 may each include a gas supply 207 and a flow controller 209 (labeled in FIG. 2 with regards to the first precursor delivery system 205 but not labeled for clarity with respect to the second precursor delivery system 206 or the reactant delivery system 208). In an embodiment in which the first treatment precursor is stored in a gaseous state, the gas supply 207 may supply the first treatment precursor to the deposition chamber 203. The gas supply 207 may be a vessel, such as a gas storage tank, that is located either locally to the deposition chamber 203 or else may be located remotely from the deposition chamber 203. Alternatively, the gas supply 207 may be a facility that independently prepares and delivers the first treatment precursor to the flow controller 209. Any suitable source for the first treatment precursor may be utilized as the gas supply 207, and all such sources are fully intended to be included within the scope of the embodiments.

The gas supply 207 may supply the desired precursor to the flow controller 209. The flow controller 209 may be utilized to control the flow of the precursor to the precursor gas controller 213 and, eventually, to the deposition chamber 203, thereby also helping to control the pressure within the deposition chamber 203. The flow controller 209 may be, e.g., a proportional valve, a modulating valve, a needle valve, a pressure regulator, a mass flow controller, combinations of these, or the like. However, any suitable method for controlling and regulating the flow of the carrier gas to the precursor canister 211 may be utilized, and all such components and methods are fully intended to be included within the scope of the embodiments.

However, as one of ordinary skill in the art will recognize, while the first precursor delivery system 205, the second precursor delivery system 206, and the reactant delivery system 208 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 200, may alternatively be utilized. All such precursor systems are fully intended to be included within the scope of the embodiments.

Additionally, in an embodiment in which the first treatment precursor is stored in a solid or liquid state, the gas supply 207 may store a carrier gas and the carrier gas may be introduced into a precursor canister (not separately illustrated), which stores the first treatment precursor in the solid or liquid state. The carrier gas is then used to push and carry the first treatment precursor as it either evaporates or sublimates into a gaseous section of the precursor canister before being sent to the precursor gas controller 213. Any suitable method and combination of units may be utilized to provide the first treatment precursor, and all such combination of units are fully intended to be included within the scope of the embodiments.

The first precursor delivery system 205, the second precursor delivery system 206, and the reactant delivery system 208 may supply their individual precursor materials into a precursor gas controller 213. The precursor gas controller 213 connects and isolates the first precursor delivery system 205, the second precursor delivery system 206, and the reactant delivery system 208 from the deposition chamber 203 in order to deliver the desired precursor materials to the deposition chamber 203. The precursor gas controller 213 may include such devices as valves, flow meters, sensors, and the like to control the delivery rates of each of the precursors, and may be controlled by instructions received from the control unit 215 (described further below with respect to FIG. 3).

The precursor gas controller 213, upon receiving instructions from the control unit 215, may open and close valves so as to connect one or more of the first precursor delivery system 205, the second precursor delivery system 206, and the reactant delivery system 208 to the deposition chamber 203 and direct a desired precursor material through a manifold 216, into the deposition chamber 203, and to a showerhead 217. The showerhead 217 may be utilized to disperse the chosen precursor material(s) into the deposition chamber 203 and may be designed to evenly disperse the precursor material in order to minimize undesired process conditions that may arise from uneven dispersal. In an embodiment the showerhead 217 may have a circular design with openings dispersed evenly around the showerhead 217 to allow for the dispersal of the desired precursor material into the deposition chamber 203.

However, as one of ordinary skill in the art will recognize, the introduction of precursor materials to the deposition chamber 203 through a single showerhead 217 or through a single point of introduction as described above is intended to be illustrative only and is not intended to be limiting to the embodiments. Any number of separate and independent showerheads 217 or other openings to introduce precursor materials into the deposition chamber 203 may alternatively be utilized. All such combinations of showerheads and other points of introduction are fully intended to be included within the scope of the embodiments.

The deposition chamber 203 may receive the desired precursor materials and expose the precursor materials to the second etch stop layer 109, and the deposition chamber 203 may be any desired shape that may be suitable for dispersing the precursor materials and contacting the precursor materials with the second etch stop layer 109. In the embodiment illustrated in FIG. 2, the deposition chamber 203 has a cylindrical sidewall and a bottom. However, the deposition chamber 203 is not limited to a cylindrical shape, and any other suitable shape, such as a hollow square tube, an octagonal shape, or the like, may be utilized. Furthermore, the deposition chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, combinations of these, and like.

Within the deposition chamber 203 the substrate 101 may be placed on a mounting platform 221 in order to position and control the substrate 101 and the second etch stop layer 109 during the treatment and deposition processes. The mounting platform 221 may include heating mechanisms in order to heat the substrate 101 during the treatment and deposition processes. Furthermore, while a single mounting platform 221 is illustrated in FIG. 2, any number of mounting platforms 221 may additionally be included within the deposition chamber 203.

Additionally, the deposition chamber 203 and the mounting platform 221 may be part of a cluster tool system (not shown). The cluster tool system may be used in conjunction with an automated handling system in order to position and place the substrate 101 into the deposition chamber 203 prior to the treatment and deposition processes, position, hold the substrate 101 during the treatment and deposition processes, and remove the substrate 101 from the deposition chamber 203 after the treatment and deposition processes.

The deposition chamber 203 may also have an exhaust outlet 225 for exhaust gases to exit the deposition chamber 203. A vacuum pump 223 may be connected to the exhaust outlet 225 of the deposition chamber 203 in order to help evacuate the exhaust gases. The vacuum pump 223, under control of the control unit 215, may also be utilized to reduce and control the pressure within the deposition chamber 203 to a desired pressure and may also be utilized to evacuate precursor materials from the deposition chamber 203 in preparation for the introduction of the next precursor material.

FIG. 3 illustrates an embodiment of the control unit 215 that may be utilized to control the precursor gas controller 213 and the vacuum pump 223 (as illustrated in FIG. 2). The control unit 215 may be any form of computer processor that can be used in an industrial setting for controlling process machines. In an embodiment the control unit 215 may comprise a processing unit 301, such as a desktop computer, a workstation, a laptop computer, or a dedicated unit customized for a particular application. The control unit 215 may be equipped with a display 303 and one or more input/output components 305, such as instruction outputs, sensor inputs, a mouse, a keyboard, printer, combinations of these, or the like. The processing unit 301 may include a central processing unit (CPU) 306, memory 308, a mass storage device 310, a video adapter 314, and an I/O interface 316 connected to a bus 312.

The bus 312 may be one or more of any type of several bus architectures including a memory bus or memory controller, a peripheral bus, or video bus. The CPU 306 may comprise any type of electronic data processor, and the memory 308 may comprise any type of system memory, such as static random access memory (SRAM), dynamic random access memory (DRAM), or read-only memory (ROM). The mass storage device 310 may comprise any type of storage device configured to store data, programs, and other information and to make the data, programs, and other information accessible via the bus 312. The mass storage device 310 may comprise, for example, one or more of a hard disk drive, a magnetic disk drive, or an optical disk drive.

The video adapter 314 and the I/O interface 316 provide interfaces to couple external input and output devices to the processing unit 301. As illustrated in FIG. 3, examples of input and output devices include the display 303 coupled to the video adapter 314 and the I/O component 305, such as a mouse, keyboard, printer, and the like, coupled to the I/O interface 316. Other devices may be coupled to the processing unit 301, and additional or fewer interface cards may be utilized. For example, a serial interface card (not shown) may be used to provide a serial interface for a printer. The processing unit 301 also may include a network interface 318 that may be a wired link to a local area network (LAN) or a wide area network (WAN) 320 and/or a wireless link.

It should be noted that the control unit 215 may include other components. For example, the control unit 215 may include power supplies, cables, a motherboard, removable storage media, cases, and the like. These other components, although not shown in FIG. 3, are considered part of the control unit 215.

Returning now to FIG. 1A, the deposition system 200 may be utilized to deposit the first dielectric layer 111 onto the second etch stop layer 109. In an embodiment the formation of the first dielectric layer 111 may be initiated by putting a first precursor material into the first precursor delivery system 205. For example, in an embodiment in which the first dielectric layer 111 is desired to be a material such as SiOC:H, the first precursor may be a backbone precursor (or a matrix precursor) with a silicon backbone to form a silicon-oxygen bonding matrix. In particular embodiments the backbone precursor may be an alkoxysilane, an aminosilane, or a cyclic type alkoxysilane-based precursor.

In some embodiments the backbone precursor comprises only alkoxysilanes. For example, in such embodiments the backbone precursor may contain an alkoxysilane including $Si(OR)_4$, $Si(OR)_3L$, $Si(OR_1)_2(OR_2)_2$, $Si(OR_1)_3(OR_2)_1$, $Si(OR_1)_2(OR_2)L$, $Si(OR_2)(OR_2)(OR_3)L$, $Si(OR_1)(OR_2)(OR_3)(OR_4)$, where R, $R_1$, $R_2$, $R_3$, $R_4$ can be $CH_3$, $C_2H_5$, $C_3H_7$, $C_4H_9$, or the like and $R_1 \neq R_2 \neq R_3 \neq R_3$, and wherein L can be H. Using these, one example of the backbone precursor that may be used is $Si(OCH_3)_2H_2$ with the following structure:

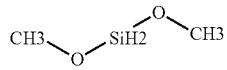

In other embodiments, the backbone precursor comprises only aminosilanes. In such an embodiment the backbone precursor may comprise $Si(N(CH_3)_2)aL_{4-a}$, $Si(N(C_2H_5)_2)_bL_{4-b}$, wherein $1 \leq a,b \leq 4$, and wherein L can be H. Using these, one example of the backbone precursor that may be used is $SiH(N(CH_3)_2)_3$ with the following structure:

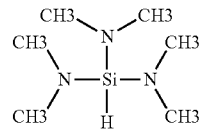

In yet other embodiments, the backbone precursor does not comprise only alkoxy- or amino-groups and may comprise both alkoxy- and amino-groups. For example, in such embodiments the backbone precursor may have the matrix contains $Si(OR)_2(N(CH_3)_2)_2$, $Si(OR)_3(N(CH_3)_2)_1$, $Si(OR)_1(N(CH_3)_2)_3$, $Si(OR)(OR_1)(N(CH_3)_2)(N(C_2H_5))$, $Si(OR)_a(N(CH_3)_2)_bL_c$, $Si(OR)_a(N(C_2H_5)_2)_bL_c$ where R, $R_1$ can be $CH_3$, $C_2H_5$, $C_3H_7$, $C_4H_9$, $R \neq R_1$, a, $b \geq 1$, L can be H. Using these, one example of the backbone precursor that may be used is $Si(OCH_3)_2(N(CH_3)_2)_2$ with the following structure:

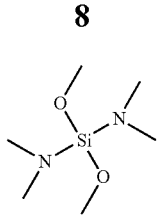

In yet another embodiment the backbone precursor comprises a cyclic structure. For example, in this embodiment the backbone precursor may be a cyclic alkoxysilane such as $(SiO)_xH_{2x}$, wherein x is greater than or equal to 4 and also less than or equal to 8. In one embodiment the backbone precursor may be a cyclic alkoxysilane such as cyclotetrasiloxane, $Si_4O_4H_8$, which has the following structure:

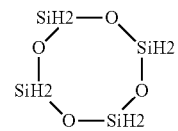

However, the above described materials for the first precursor material are intended to be illustrative and are not intended to be limiting. Rather, any suitable materials may be utilized for the first precursor material. All such materials are fully intended to be included within the scope of the embodiments.

Additionally, a second precursor material may be placed into the second precursor delivery system 206. In an embodiment the second precursor material is a porogen precursor or a hydrocarbon-based precursor which may be a non-chain type, a cyclic type, or a hybrid type of hydrocarbon. In an embodiment in which the second precursor material is a non-chain type hydrocarbon, the second precursor material may be represented by the formula $CH(R_1)_x(R_2)_y(R_3)_z$, wherein $R_1$, $R_2$, and $R_3$ may independently be $CH_3$, $C_2H_5$, $C_3H_7$, or the like. Additionally, a sum of x and y and z in the second precursor material is equal to 3 while each of x, y, and z in the second precursor material are less than or equal to 3. In a particular embodiment the non-chain type hydrocarbon may be $CH(CH_3)(CH_3)(CH_3)$ with the following structure:

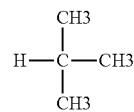

In another embodiment in which the second precursor material is a non-chain type hydrocarbon, the second precursor material may be represented by the formula $C(R_1)_w(R_2)_x(R_3)_y(R_4)_z$, $C(R_1)(R_2)(R_3)(R_4)$, wherein $R_1$, $R_2$, $R_3$, and $R_4$ are each independently $CH_3$, $C_2H_5$, $C_3H_7$, or the like, and wherein a sum of w, x, y, and z is equal to 4 while each of w, x, y, z are greater than or equal to 1. In a particular embodiment the non-chain type hydrocarbon may be $C(CH_3)(CH_3)(CH_3)(CH_3)$ with the following structure:

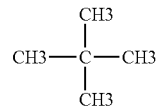

During the reactions of these precursors, the silicon precursor will react with oxygen to form an Si—O—Si intermediary, then react with the porogen in order to incorporate the porogen into the silicon base precursor and occupy a site within the precursor. After the UV curing, the porogen will burn off, leaving the first dielectric layer 111.

In an embodiment in which the second precursor material is a cyclic hydrocarbon, the cyclic hydrocarbon may contain only carbon-carbon single bonds. In a particular embodiment the cyclic hydrocarbon may be $C_xH_y$, wherein x is less than or equal to 8 and y is less than or equal to 16. For example, in such an embodiment the cyclic hydrocarbon may be $C_6H_{12}$ with the following structure:

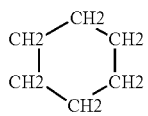

In another embodiment in which the second precursor material is a cyclic hydrocarbon, the cyclic hydrocarbon may contain at least one carbon-carbon double bond. In a particular embodiment the cyclic hydrocarbon may be $C_xH_y$, wherein x is less than or equal to 8 and y is less than or equal to 14. For example, in such an embodiment the cyclic hydrocarbon may be $C_4H_4$ with the following structure:

In an embodiment in which the second precursor material comprises a hybrid hydrocarbon structure, the second precursor material may comprise only carbon-carbon single bonds, at least one cyclic structure, and at least one branched carbon group. In a particular embodiment the second precursor material comprises $C_xH_yR_z$, wherein R is $CH_3$, $C_2H_5$, $C_3H_7$, or the like, x is greater than or equal to 3 and also less than or equal to 8, z is greater than or equal to 1 and also less than or equal to 2x, and a sum of y and z is equal to 2x. For example, in such an embodiment the hybrid hydrocarbon may be $C_3H_3(CH_3)_3$ with the following structure:

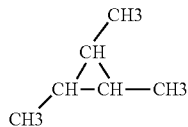

In another embodiment in which the second precursor material comprises only carbon-carbon single bonds, at least one cyclic structure, and at least one branched carbon group, the second precursor material may be $C_vH_w(R_1)_x(R_2)_y(R_3)_z$, wherein $R_1$, $R_2$, and $R_3$ are each independently $CH_3$, $C_2H_5$, $C_3H_7$, or the like. Additionally, v is greater than or equal to 3 and also less than or equal to 8, a sum of x and y and z is greater than or equal to 2, and a sum of w and x and y and z is equal to 2v. For example, in such an embodiment the hybrid hydrocarbon may be $C_3H_4(CH_3)(C_3H_7)$ with the following structure:

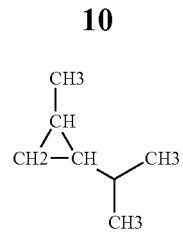

In another embodiment the hybrid hydrocarbon comprises at least one cyclic structure which comprises at least one carbon-carbon double bond and at least one branch hydrocarbon. In a particular embodiment in which n is the number of carbon-carbon double bonds, the second precursor material may be $C_xH_yR_z$, wherein R is $CH_3$, $C_2H_5$, $C_3H_7$, or the like, x is greater than or equal to 3 and also less than or equal to 8, y is greater than or equal to 1 and also less than or equal to 2x, and a sum of y and z is equal to 2x−2n. For example, in such an embodiment the hybrid hydrocarbon may be $C_3H_2(CH_3)_2$ with the following structure:

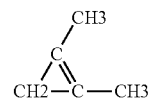

In yet another embodiment in which the second precursor material is a hybrid structure with at least one carbon-carbon double bond and n is the number of carbon-carbon double bonds, the second precursor material may be $C_vH_w(R_1)_x(R_2)_y(R_3)_z$, wherein $R_1$, $R_2$, and $R_3$ are each independently $CH_3$, $C_2H_5$, or $C_3H_7$, v is greater than or equal to 3 and also less than or equal to 8, a sum of x and y and z is greater than or equal to 2, and a sum of w and x and y and z is equal to 2v−2n. For example, in such an embodiment the hybrid hydrocarbon may be $C_5H_6(CH_3)(C_2H_5)$ with the following structure:

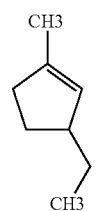

The reactive gas (or reactive material) may be placed into the reactant delivery system 208. In an embodiment the reactive gas is an oxygen based reactive gas such as $O_2$, $CO_2$, $N_2O$, $N_2O_2$, combinations of these, or the like. However, any suitable precursor material may be utilized. During the reactions, while some of the carbon will be burned to either CO or CO2, by utilizing the parameters described below, the parameters may be tuned to minimize the carbon burn to CO and CO2.

Once the first precursor material, the second precursor material, and the reactant material have been placed into the first precursor delivery system 205, the second precursor delivery system 206, and the reactant delivery system 208, respectively, the formation of the first dielectric layer 111 may be initiated by the control unit 215 sending an instruction to the precursor gas controller 213 to connect the first precursor delivery system 205, the second precursor delivery system 206, and the reactant delivery system 208 to the deposition chamber 203. Once connected, the first precursor delivery system 205, the second precursor delivery system 206, and the reactant delivery system 208 can deliver the first precursor material, the second precursor material, and the reactant material to the showerhead 217 through the precursor gas controller 213 and the manifold 216. The showerhead 217 can then disperse the first precursor material, the second precursor material, and the reactant material into the deposition chamber 203, wherein the first precursor material, the second precursor material, and the reactant material can be adsorbed and react with each other to form the first dielectric layer 111 on the second etch stop layer 109.

In the embodiment to form a layer of SiOC:H, the first precursor material may be flowed into the deposition chamber 203 at a flow rate of between about 100 mgm and about 5000 mgm, the second precursor material may be flowed into the deposition chamber 203 at a flow rate of between about 50 mgm and about 2000 mgm, such as about 100 mgm, and the reactant material may be flowed into the deposition chamber 203 at a flow rate of between about 10 sccm and about 500 sccm, such as about 100 sccm. Additionally, the deposition chamber 203 may be held at a pressure of between about 5 torr and about 12 torr, such as about 9 torr, and a temperature of between about 100° C. and about 400° C., such as about 200° C. However, as one of ordinary skill in the art will recognize, these process conditions are only intended to be illustrative, as any suitable process conditions may be utilized while remaining within the scope of the embodiments.

Figure 1B:
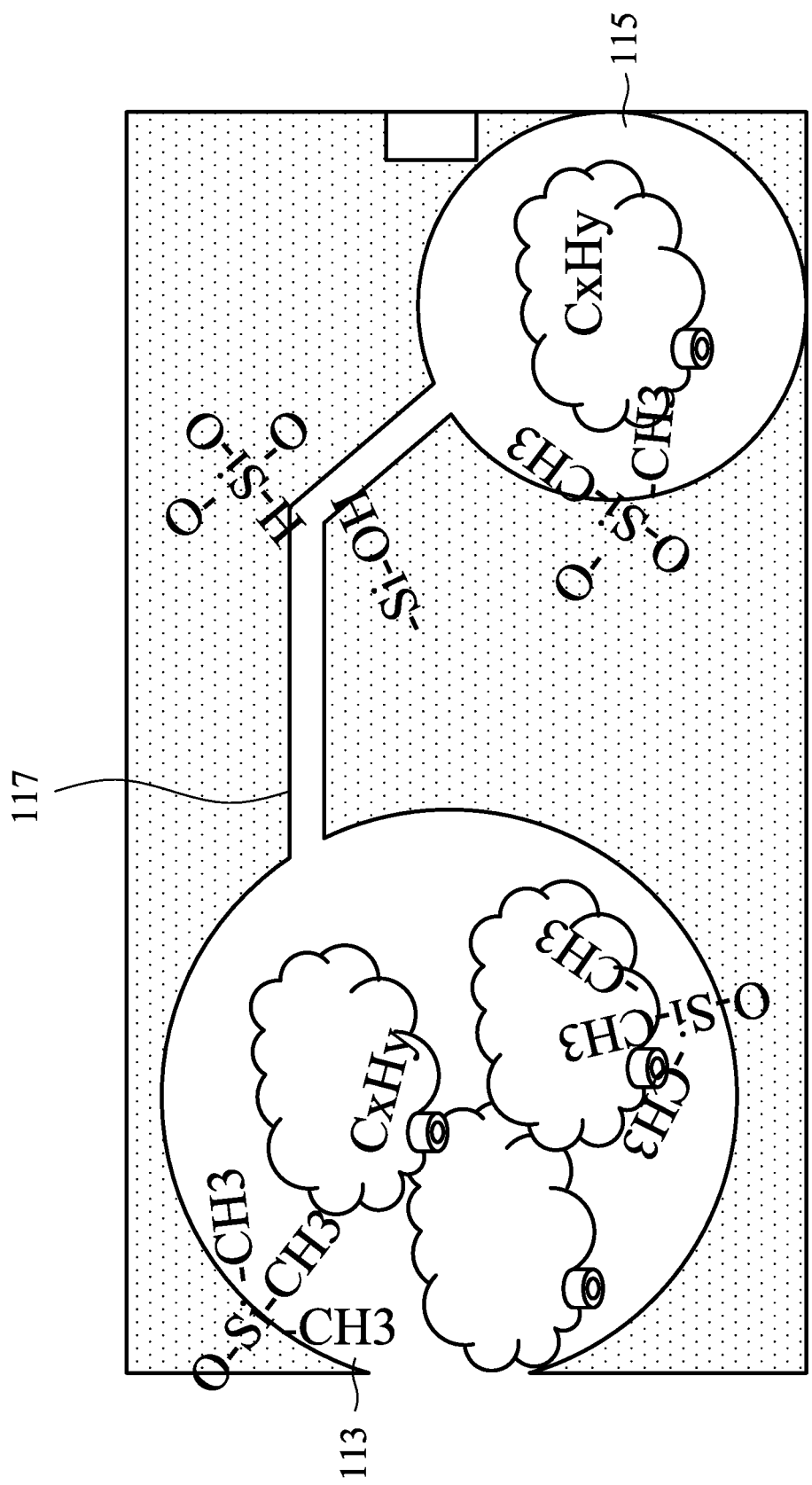

As illustrated in FIG. 1B, by forming the first dielectric layer 111 using the precursors and parameters as described above, the first dielectric layer 111 (with both the matrix material and the porogen material) may be formed with pores that have multiple sizes. For example, the first dielectric layer 111 may be formed with both meso-isolated pores 113 (e.g., pores with a diameter of between about 5 Å and about 20 Å) and micro-isolated pores 115 (e.g., pores with a diameter of between about 20 Å and about 200 Å). Each of these pores may have sidewalls that are terminated with hydrocarbon groups (e.g., $CH_3$) in addition to having the porogen material trapped within the individual pores.

Additionally, the first dielectric layer 111 will additionally have channels 117 that are formed within the matrix material. These channels 117 interconnect the individual pores (e.g., interconnect the meso-isolated pores 113 with either the micro-isolated pores 115 or other meso-isolated pores 113). Additionally, the channels 117 will have sidewalls terminated not by hydrocarbon groups, but by OH groups or H groups.

As such, because the first dielectric layer 111 has the channels 117 that are terminated with OH and H groups, the sidewalls of the channels 117 are not terminated with hydrocarbon groups such as $CH_3$. Without these hydrocarbon terminal groups within the channels, the sidewalls of the channel will be closer to each other than otherwise possible, and the presence of even smaller pores interconnecting the meso-isolated pores 113 and the micro-isolated pores 115 can be reduced or eliminated. For example, the sidewalls of the channel 117 may be separated by a distance of between about 2 Å and about 20 Å, such as about 4 Å.

Figure 1C:
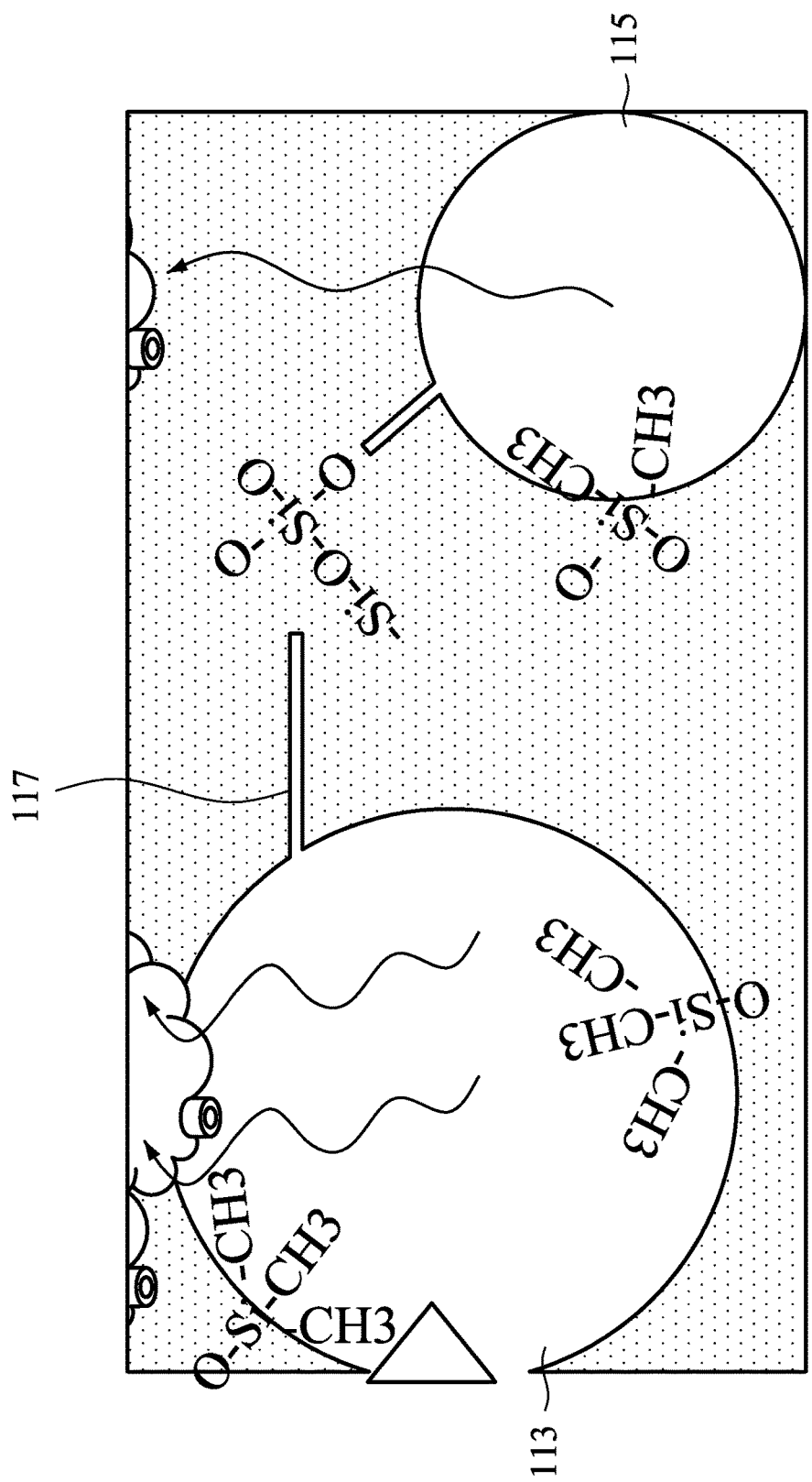

FIG. 1C illustrates that, after the as-deposited film has been formed with the porogen dispersed within the matrix material, the porogen is removed from the matrix and leave the pores within the first dielectric layer 111. In an embodiment the removal of the porogen is performed by an ultraviolet cure process. For example, the first dielectric layer 111 may be cured for a time of between about 10 s and about 180 s, such as about 90 s. However, any suitable time may be utilized.

Additionally, as one of ordinary skill in the art will recognize, the UV cure process described above is not the only method that may be utilized to remove the porogen from the matrix material. Other suitable processes, such as a thermal anneal utilizing microwaves to decompose the porogen, may alternatively be utilized. These and any other suitable process to remove all or a portion of the porogen are all fully intended to be included within the scope of the embodiments.

Also, as the porogen is being removed, the curing of the first dielectric layer 111 will also cause a reaction to occur within the channel 117. In particular, the OH groups and the H groups will decompose and react with each other to form water ($H_2O$) which will also be removed during the UV cure. Additionally, because the hydrocarbon groups is not present, the sidewalls of the channel 117 are close enough so that the terminal groups left behind from the react of OH and H groups (e.g., terminal groups such as dangling $Si^+$ bonds) are close enough to react with each other, thereby repairing and closing the channel 117 and further isolating the meso-isolated pores 113 and the micro-isolated pores 115. As such, the matrix material of the first dielectric layer 111 is formed either without or with a reduced number of channels 117, and the matrix material outside of the pores (e.g., the meso-isolated pores 113 and the micro-isolated pores 115) of the first dielectric layer 111 can be formed without terminal organic groups (e.g., terminal methyl groups) while the pores may still comprise terminal organic groups.

By reducing or closing the presence of channels 117, the first dielectric layer 111 is formed to be a channel-less porous low K material. Additionally, the first dielectric layer 111 has a diffusivity of below about $10^{-7}$ cm$^2$/s in toluene but also has a meso- or micro-isolated pore structure with pore diameters of greater than about 115 Å. In particular embodiments in which the first dielectric layer 111 is formed with SiOC:H, the first dielectric layer 111 is formed with a carbon percentage of less than about 8 at %. By increasing the isolation of the pores, the porosity of the first dielectric layer 111 may be between about 10% and about 35%, leading to a K value of between about 2.4 and about 3.5. Additionally, by leaving carbon at the surfaces of the pores, the pore surface remains hydrophobic and better able to resist a wet chemical etching process.

Figure 1D:
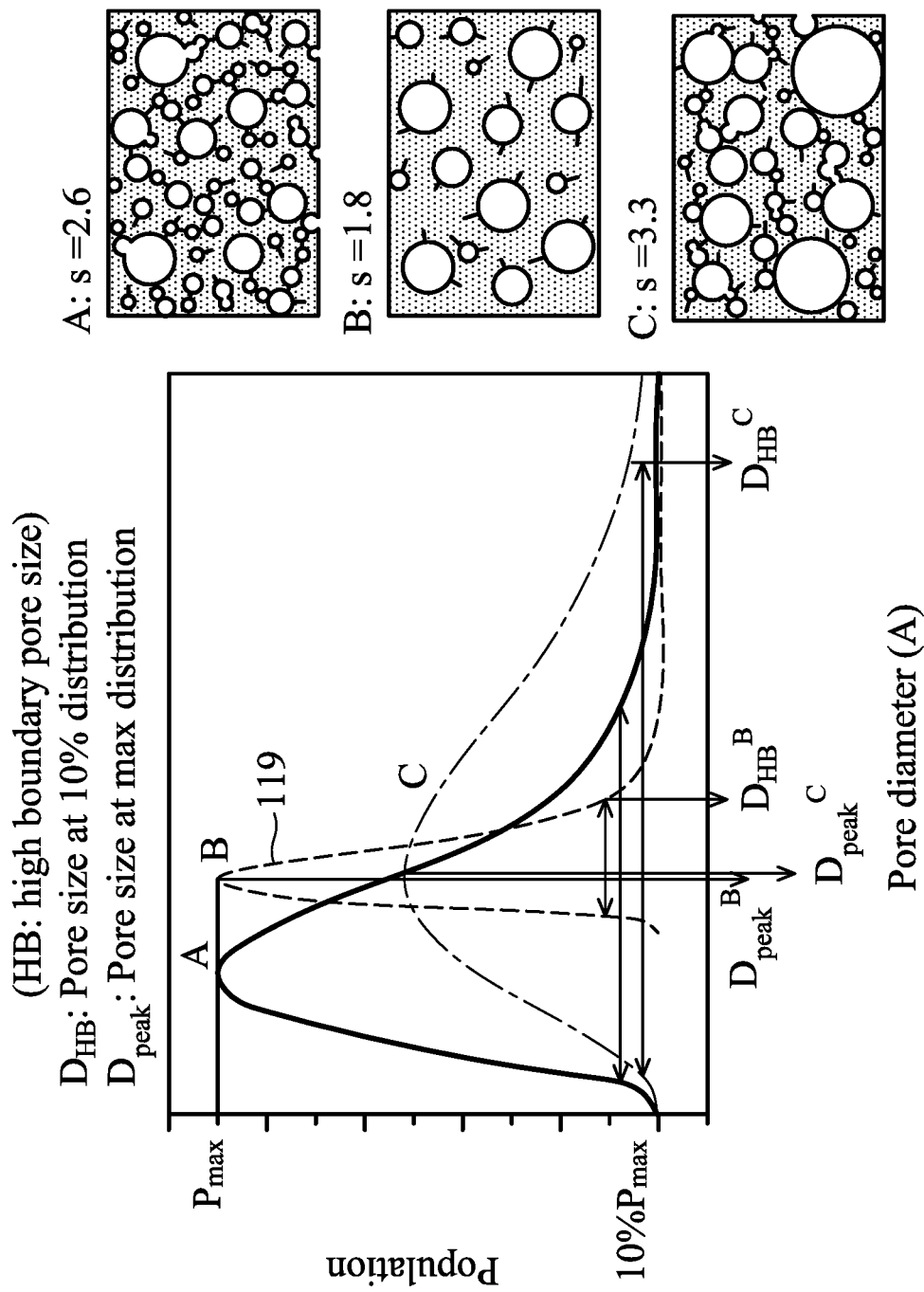

FIG. 1D illustrates a pore size distribution that may be obtained by the first dielectric layer 111. In this embodiment the first dielectric layer 111 has a pore size distribution 119 with a scaling factor, S, wherein S is defined as a ratio of a high boundary diameter $D_{HB}$ at 10% peak population to a peak diameter $D_{peak}$. In these embodiments the pore size distribution using the processes and materials described herein have a scaling factor S that is less than or equal to about 1.8. This is much less than other deposition process, which may have scaling factors S such as 2.6 or 3.3.

In another particular embodiment, the first precursor may comprise at least one alkoxy- and at least one amino-group (e.g., $Si(OCH_3)_2(N(CH_3)_2)_2$) and the second precursor comprises a cyclic hydrocarbon with two double bonds (e.g., $C_4H_4$). In such an embodiment the Si bonds will break easily, and the Si will then react with oxygen, thereby causing the porogen to incorporate the Si—O bonding. Following a UV cure to remove the porogen, the first dielectric layer 111 obtained will have a k value of between about 2.8 and about 3.1 Additionally, the carbon percentage can be between about 6 at % and about 8 at % with a porosity of between about 18% and about 30%.

In another particular embodiment in which the first precursor comprises an alkoxysilane or an aminosilane (e.g., $SiH(N(C_2H_5)_2)_3$) and the second precursor comprises a non-chain type hydrocarbon with single bonds (e.g., $CH(CH_3)(CH_3)(CH_3)$), the alkoxysilane or aminosilane will dissociate into $Si-(N(CH_3)_2)_2$, which will easily react with the non-chain type hydrocarbon with single bonds to form the first dielectric layer 111. In this embodiment, the first dielectric layer 111 can obtain a k value of between about 3.0 and about 3.5. Additionally, the carbon percentage can be between about 5 at % and about 7 at % with a porosity of between about 10% and about 20%.

In yet another particular embodiment in which the first precursor comprises a cyclic type alkoxysilane-based precursor (e.g., $(SiO)_4H_8$) and the second precursor comprises a hybrid cyclic structure comprising one carbon-carbon double bond (e.g., $C_5H_6(CH_3)(C_2H_5)$), the first dielectric layer 111 can obtain a k value of between about 2.4 and about 3.0 Additionally, the carbon percentage can be between about 4 at % and about 6 at % with a porosity of between about 28% and about 35%.

Figure 4:
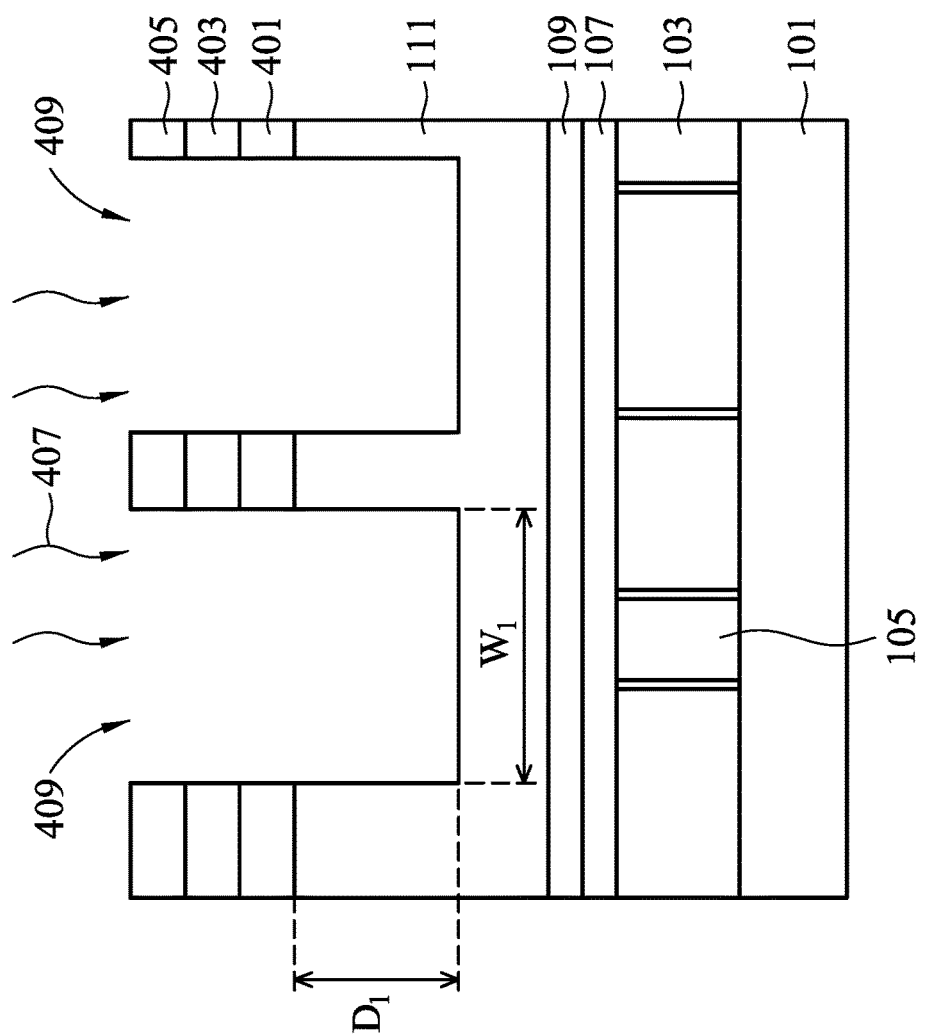
FIG. 4 illustrates formation of an opening in accordance with some embodiments.

FIG. 4 illustrates a placement of an anti-reflective layer 401, a first hardmask 403, and a first photoresist 405 over the first hardmask 403. In an embodiment the anti-reflective layer 401 may be a nitrogen-free anti-reflective coating and may comprise a polymer resin, a catalyst, and a cross-linking agent, all of which are placed into a solvent for dispersal. Once the material for the anti-reflective layer 401 has been prepared, the material for the anti-reflective layer 401 may be utilized by initially applying the material for the anti-reflective layer 401 onto the first dielectric layer 111. The material for the anti-reflective layer 401 may be applied to the first dielectric layer 111 so that the material for the anti-reflective layer 401 coats an upper exposed surface of the first dielectric layer 111, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the anti-reflective layer 401 may be applied such that it has a thickness of between about 50 nm and about 500 nm, such as about 300 nm.

Once the anti-reflective layer 401 has been formed, the first hardmask 403 may be formed over the anti-reflective layer 401. In an embodiment the first hardmask 403 may be a masking material such as titanium nitride (TiN), although any other suitable material, such as titanium oxide may be used. The first hardmask 403 may be formed using a deposition process such as chemical vapor deposition, physical vapor deposition, atomic layer deposition, combinations of these, or the like, and may be formed to an initial thickness of between about 50 Å and about 800 Å, such as about 300 Å. However, any suitable thickness may be utilized.

Once formed, the first hardmask 403 may be patterned in order to provide a masking layer for a subsequent etching process (e.g. a first etching process 407 described below) to form one or more trench openings 409. In an embodiment the first hardmask 403 may be patterned by placing the first photoresist 405 over the first hardmask 403 and then exposing and developing the first photoresist 405 to form a patterned photoresist. Once the first photoresist 405 has been patterned, the pattern of the first photoresist 405 is then transferred to the first hardmask 403 using, e.g., an anisotropic etching process such as a reactive ion etching process. However, any suitable process may be utilized.

In an embodiment the first hardmask 403 may be patterned to form a mask for the trench openings 409. As such, the first hardmask 403 may be patterned such that the trench openings 409 have a first width $W_1$ of between about 10 nm and about 300 nm, such as about 40 nm. However, any suitable dimensions may be utilized.

Once the first hardmask 403 has been patterned, the pattern of the first hardmask 403 may be transferred to the first dielectric layer 111 using a first etching process (represented in FIG. 4 by the wavy lines labeled 407). In an embodiment the first etching process 407 may be, e.g., an anisotropic etching process such as a reactive ion etch with etchants suitable to etch the first dielectric layer 111, such as $CF_4$ or $C_2F_6$. However, any suitable etching method or combination of etching methods may be utilized.

By using the first etch process 407 and the first hardmask 403, the pattern of the first hardmask 403 is transferred to the anti-reflective layer 401 and then to the first dielectric layer 111 to form the trench openings 409. In an embodiment the transfer of the pattern from the first hardmask 403 into the first dielectric layer 111 helps to form trench portions 805 of the interconnect 801 into the first dielectric layer 111. In a particular embodiment, the trench portion 805 of the interconnect 801 may be formed to extend into the first dielectric layer 111 a first depth $D_1$ of between about 200 Å and about 2000 Å, such as about 800 Å. However, any suitable depth may be utilized.

Figure 5:
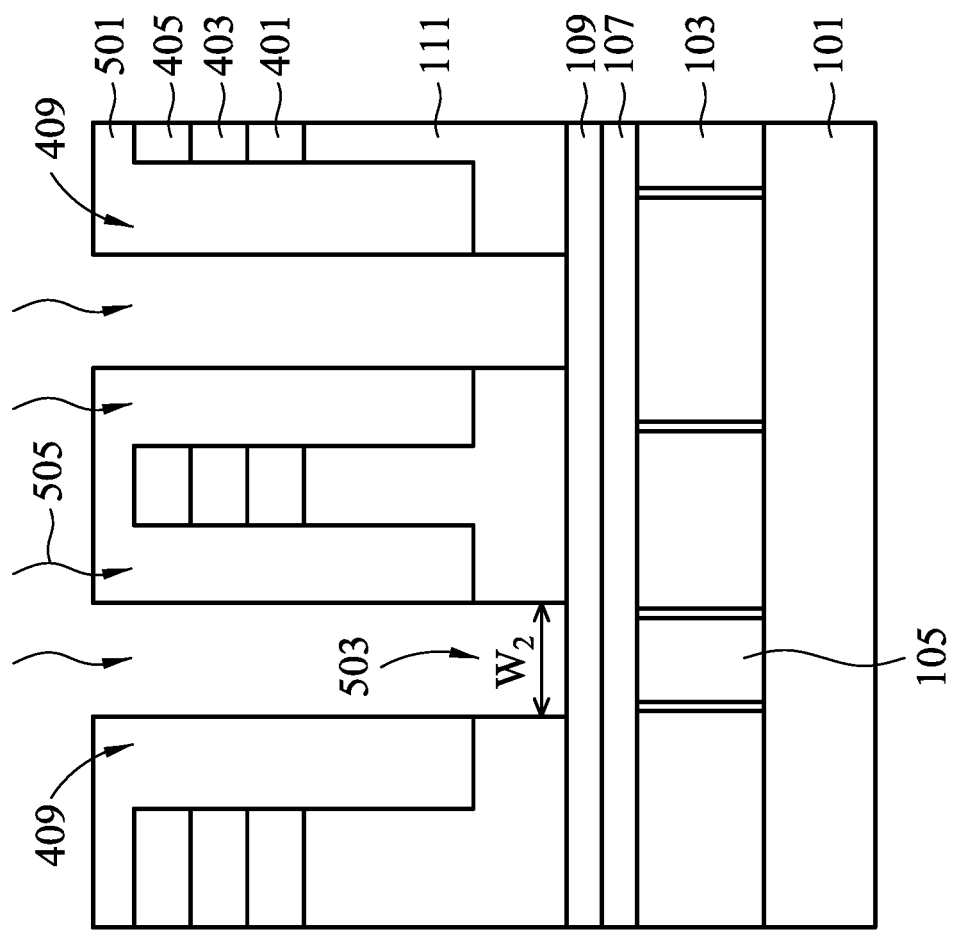
FIG. 5 illustrates a formation of a via in accordance with some embodiments.

FIG. 5 illustrates that, once the trench openings 409 have been formed, the first photoresist 405 is removed. In an embodiment the first photoresist 405 is removed using a process such as ashing, whereby the temperature of the first photoresist 405 is increased until the first photoresist 405 experiences a thermal decomposition, at which point the first photoresist 405 may be easily removed. However, any other suitable process, such as a wet or dry etch, or even removing the first photoresist 405 using the same etching process that forms the trench openings 409, may be used.

Once the first photoresist 405 has been removed, a second photoresist 501 may be deposited and patterned to form openings to assist in the patterning of via openings 503 through the trench opening 409. In an embodiment the second photoresist 501 is a tri-layer photoresist, with a bottom anti-reflective coating (BARC) layer, an intermediate mask layer, and a top photoresist layer (not separately illustrated within FIG. 5). However, any suitable type of photosensitive material or combination of materials may be utilized.

Once the second photoresist 501 has been placed over the first hardmask 403 and the trench openings 409, the second photoresist 501 is patterned. In an embodiment the second photoresist 501 may be patterned by exposing a photosensitive material within the second photoresist 501 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photoresist 501 are different from the physical properties of the unexposed portions of the second photoresist 501. The second photoresist 501 may then be developed with, e.g., a developer (not separately illustrated), in order to separate the exposed portion of the second photoresist 501 from the unexposed portion of the second photoresist 501, and the pattern of the top photoresist layer may be extended through the intermediate mask layer and the bottom anti-reflective coating layer.

In an embodiment the second photoresist 501 may be patterned such that the second photoresist 501 can be used to form the via openings 503 through the first dielectric layer 111. As such, the second photoresist 501 may be formed to have openings with a second width $W_2$ of between about 10 nm and about 300 nm, such as about 40 nm. However, any suitable dimensions may be utilized.

Once the second photoresist 501 has been placed and patterned, a second etching process (represented in FIG. 5 by the wavy lines labeled 501) may be used to form the via openings 503 which will be filled to form via portions 803 of the interconnect 801. In an embodiment the second etching process 505 may be similar to the first etching process 407. For example, the second etching process 505 may be an anisotropic etching process such as a reactive ion etching process that utilizes etchants that are selective to the first dielectric layer 111. However, any suitable etching process or etchants may be utilized.

The second etching process 505 extends the via openings 503 from the trench opening 409 all of the way through the first dielectric layer 111 and will expose the underlying second etch stop layer 109, which material is chosen to stop or at least slow down the second etching process 505 and prevent the second etching process 505 from etching past the second etch stop layer 109.

Figure 6:
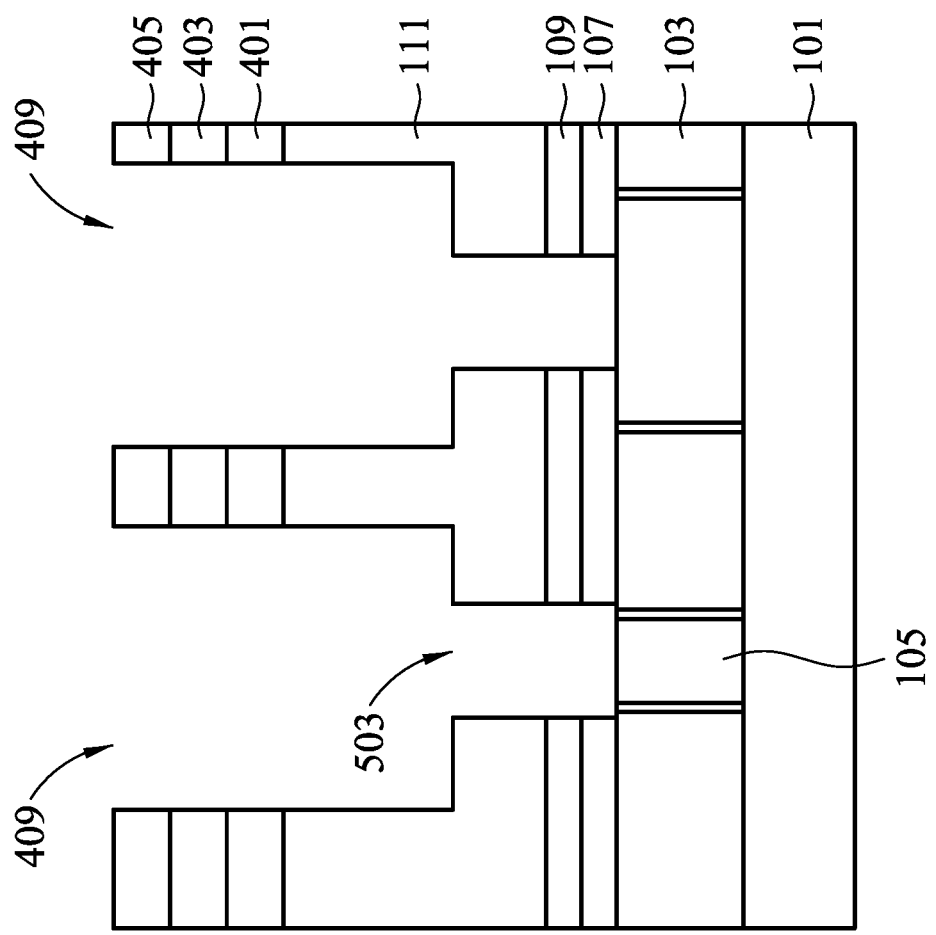
FIG. 6 illustrates a removal of a photoresist in accordance with some embodiments.

FIG. 6 illustrates that the via openings 503 may be extended through the second etch stop layer 109. In an embodiment the breakthrough of the via openings 503 through the second etch stop layer 109 is performed with a second wet etching process. In an embodiment the second wet etching process may utilize a liquid second etchant which is brought into contact with the second etch stop layer 109 along with the remainder of the structure. For example, the second etch stop layer 109 may be dipped into a liquid pool of the second etchant at a temperature of between about 25° C. and about 80° C., such as about 60° C. However, any suitable method of contacting the second etchant to the second etch stop layer 109 may be utilized.

FIG. 6 illustrates further processing that may be used to form the interconnect 801. In an embodiment, after the second etch stop layer 109 has been patterned to extend the via openings 503, the via openings 503 may be extended through the first etch stop layer 107. In an embodiment the extension of the via openings 503 through the first etch stop layer 107 exposes the underlying conductive elements 105, and may be performed using, e.g., a wet or dry etching process. However, any suitable patterning or removal process may be utilized.

Additionally, at this point, or at any other suitable point during the process, the second photoresist 501 may be removed. In an embodiment the second photoresist 501 is removed using a process such as ashing, whereby the temperature of the second photoresist 501 is increased until the second photoresist 501 experiences a thermal decomposition, at which point the second photoresist 501 may be easily removed. However, any other suitable process, such as a wet or dry etch, may be used.

Once the conductive elements 105 have been exposed, an optional cleaning process may be performed in order to prepare the surfaces of the via openings 503 and trench openings 409. In an embodiment an optional plasma ashing cleaning process may be utilized prior to the formation of a first barrier layer 701 (not illustrated in FIG. 6 but illustrated and described below with respect to FIG. 7) in order to clean and prepare the sidewalls of the trench openings 409 and the via openings 503 to receive a first barrier layer 701. The plasma ashing cleaning process may be performed by generating a plasma from a cleaning precursor such as oxygen or the like and then exposing the first dielectric layer 111 to the plasma within an inert environment such as nitrogen, argon, or the like. However, any suitable cleaning process may alternatively be utilized.

Figure 7:
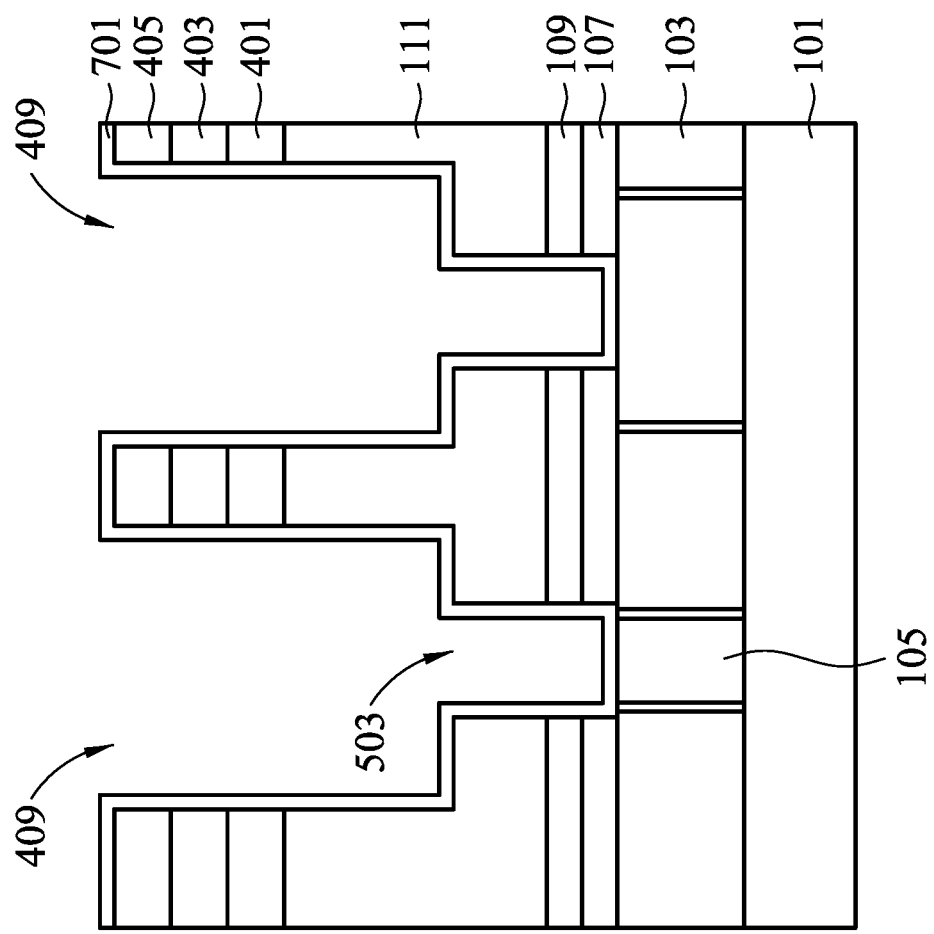
FIG. 7 illustrates a formation of a barrier layer in accordance with some embodiments.

FIG. 7 illustrates that, after the cleaning process has been completed, the first barrier layer 701 may be deposited in order to help isolate and protect a subsequently formed conductive material (discussed further below). In an embodiment the first barrier layer 701 may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer 701 may be formed to have a thickness of between about 0.1 μm and about 20 μm, such as about 0.5 μm. However, any suitable material, process, or thickness may be utilized.

Figure 8:
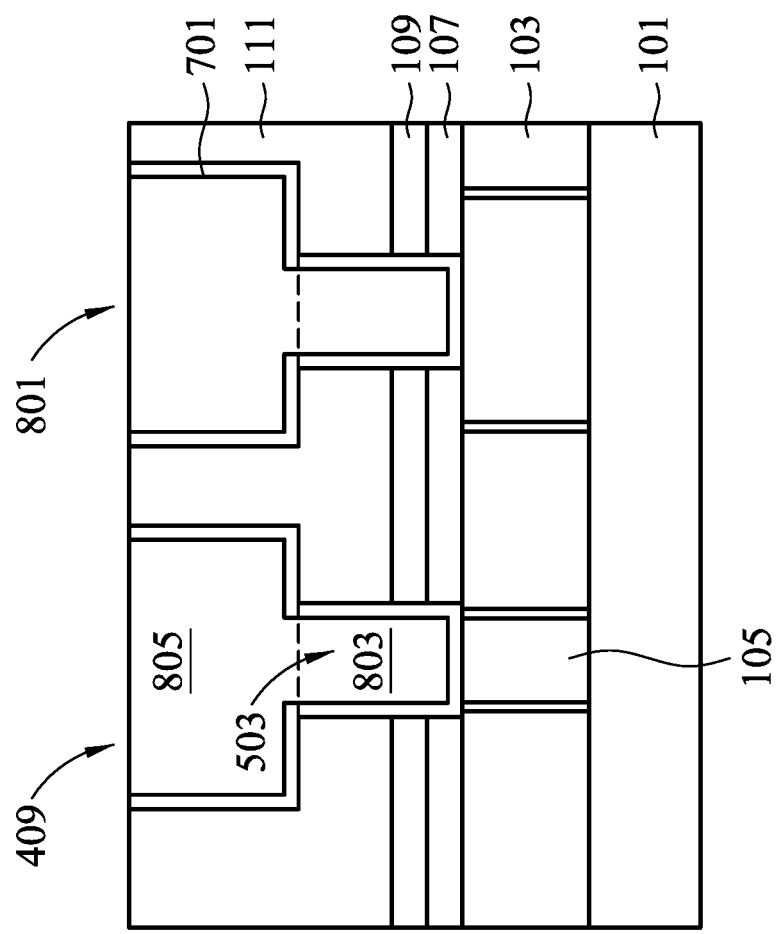
FIG. 8 illustrates a formation of an interconnect in accordance with some embodiments.

FIG. 8 illustrates that, once the first barrier layer 701 has been formed to line the via openings 503 and the trench opening 409, the via openings 503 and the trench opening 409 are filled with a conductive material to form the interconnect 801 with a via portion 803 (within the via openings 503) and the trench portion 805 (within the trench opening 409, and illustrated as being separated from the via portion 803 using a dashed line, although there may or may not be a physical indication of the separation). The conductive material may comprise copper, although other suitable materials such as aluminum, alloys, doped polysilicon, combinations thereof, and the like, may alternatively be utilized. The conductive material may be formed by depositing a seed layer (not separately illustrated), electroplating copper onto the seed layer, and filling and overfilling the via openings 503 and the trench opening 409. Once the via openings 503 and the trench opening 409 have been filled, excess portions of the first barrier layer 701, the seed layer, the anti-reflective layer 401, the first hardmask 403, the first photoresist 405 and conductive material outside of the via openings 503 and the trench opening 409 may be removed through a planarization process such as chemical mechanical polishing (CMP), although any suitable removal process may be used.

Figure 9:
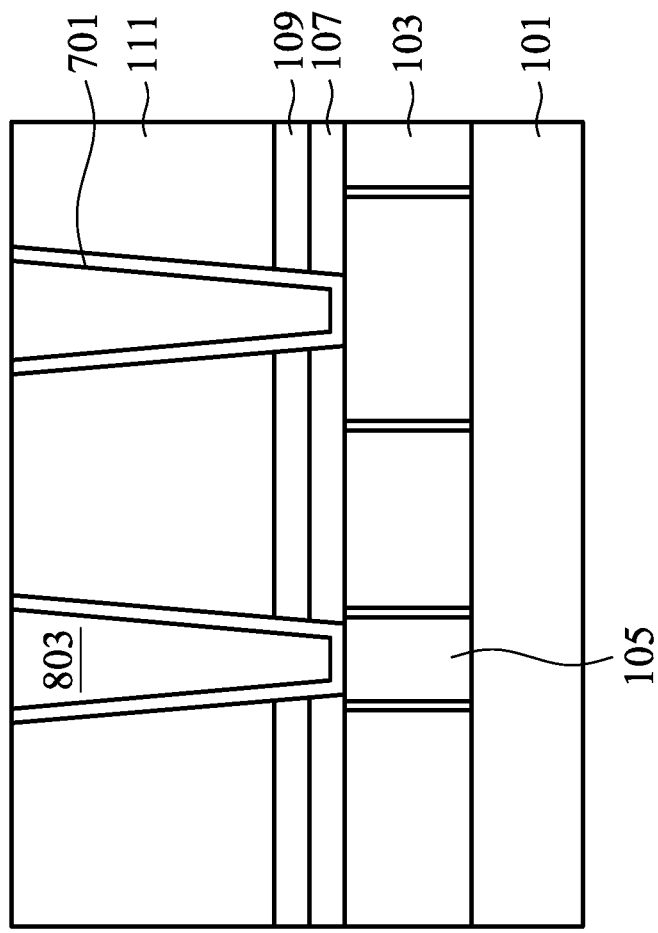
FIG. 9 illustrates a formation of an interconnect in a single damascene embodiment in accordance with some embodiments.

FIG. 9 illustrates another embodiment in which the above described process is utilized in a single damascene process (instead of a dual damascene process as described above with respect to FIGS. 1-8). In this embodiment one or more etching processes are utilized to form a via that extends through the first dielectric layer 111, the second etch stop layer 109 and the first etch stop layer 107. Once the opening has been formed, the first barrier layer 701 and the conductive material may fill the opening and then excess material outside of the opening may be removed using, e.g., a planarization process such as a chemical mechanical polishing process. However, any suitable process may be utilized.

In accordance with an embodiment, a method of manufacturing a semiconductor device comprising introducing a first precursor onto a substrate, wherein the first precursor comprises a silicon backbone precursor, is provided. A second precursor is introduced onto the substrate such that the first precursor and the second precursor react with each other to form a dielectric layer with a porogen, the second precursor comprising a hydrocarbon. The porogen is removed from the dielectric layer to form a porous dielectric layer.

In accordance with another embodiment, a method of manufacturing a semiconductor device comprising depositing a dielectric layer onto a substrate using a chemical vapor deposition process, wherein the chemical vapor deposition process utilizes at least a hydrocarbon porogen precursor and a silicon backbone precursor, is provided. The dielectric layer is cured to remove a porogen from pores within a silicon-based matrix, wherein the curing also closes channels within the silicon-based matrix.

In accordance with yet another embodiment, a semiconductor device comprising a conductive structure embedded within a substrate is provided. A low-k dielectric material is over the substrate, wherein the low-k dielectric material has a diffusivity below $10^{-7}$ cm$^2$/s in toluene and pore diameters of greater than about 11 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   introducing a first precursor onto a substrate, wherein the first precursor is a matrix precursor;
   introducing a second precursor onto the substrate such that the first precursor and the second precursor react with each other to form a dielectric layer with a porogen, the second precursor being a porogen precursor and comprising a hydrocarbon; and
   removing the porogen from the dielectric layer, wherein the removing the porogen also closes one or more channels within the dielectric layer.

2. The method of claim 1, wherein the matrix precursor comprises an alkoxysilane group.

3. The method of claim 1, wherein the matrix precursor comprises an aminosilane group.

4. The method of claim 1, wherein the matrix precursor comprises both an aminosilane group and an alkoxysilane group.

5. The method of claim 1, wherein the matrix precursor comprises a cyclic alkoxysilane.

6. The method of claim 1, wherein the porogen precursor comprises a cyclic structure.

7. The method of claim 1, wherein the porogen precursor comprises a non-chain type group.

8. A method of manufacturing a semiconductor device, the method comprising:
   depositing a dielectric layer onto a substrate using a chemical vapor deposition process, wherein the chemical vapor deposition process utilizes a hydrocarbon porogen and a matrix precursor; and
   curing the dielectric layer to cross link Si—O—Si and remove the hydrocarbon porogen to form a channel-less low k film with isolated pores.

9. The method of claim 8, wherein the curing the dielectric layer further comprises removing the hydrocarbon porogen while leaving the isolated pores, wherein the isolated pores have surfaces which are hydrophobic.

10. The method of claim 8, wherein the isolated pores have a pore diameter of between about 5 Å and about 20 Å.

11. The method of claim 8, wherein the isolated pores have a pore diameter of between about 20 Å and about 200 Å.

12. The method of claim 8, wherein the isolated pores comprise both meso-isolated pores and micro-isolated pores.

13. The method of claim 8, wherein after the curing the dielectric layer the dielectric layer has a scaling factor of less than or equal to about 1.8.

14. The method of claim 8, wherein the curing the dielectric layer is performed at least in part with an ultraviolet curing process.

15. A method of manufacturing a semiconductor device, the method comprising:
   forming a conductive structure embedded within a substrate; and
   forming a low-k dielectric material over the substrate, wherein the low-k dielectric material has a diffusivity below $10^{-7}$ in toluene and pore diameters of greater than about 11 Å, and wherein the low-k dielectric material is SiOC:H and wherein a carbon content of the SiOC:H is less than 8 at %.

16. The method of claim 15, wherein the low-k dielectric material has a porosity of between about 10% and about 35%.

17. The method of claim 15, wherein the low-k dielectric material has a scaling factor of less or equal to about 1.8.

18. The method of claim 15, wherein the low-k dielectric material has a k-value of between about 2.4 and about 3.5.

19. The method of claim 15, wherein the low-k dielectric material is a channel-less low-k dielectric material.

20. The method of claim 15, wherein a surface of the pores is hydrophobic.

* * * * *